United States Patent [19]

Ono et al.

[11] B 3,923,569

[45] Dec. 2, 1975

[54] METHOD OF ETCHING A SEMICONDUCTOR ELEMENT

[75] Inventors: Takuhiro Ono; Masafumi Hashimoto, both of Kawasaki, Japan

[73] Assignee: Matsushita Electric Industrial Co., Ltd., Kadoma, Japan

[22] Filed: May 17, 1973

[21] Appl. No.: 361,265

[44] Published under the Trial Voluntary Protest Program on January 28, 1975 as document no. B 361,265.

[30] Foreign Application Priority Data

May 18, 1972 Japan .............................. 47-49612

[52] U.S. Cl. .................... 156/17; 29/580; 252/79.2

[51] Int. Cl.[2] ........................................... H01L 5/00

[58] Field of Search ............... 156/17, 18; 252/79.2; 29/580

[56] References Cited

FOREIGN PATENTS OR APPLICATIONS 200,890 1/1966 Sweden

*Primary Examiner*—Douglas J. Drummond

*Assistant Examiner*—J. W. Massie, III

[57] ABSTRACT

Gas etching method in which an etching gas generated through reaction of HC1 and $HNO_3$ is applied onto a semiconductor substrate while maintaining the temperature of the substrate at a relatively low temperature above the boiling point of water. This etching method is particularly effective for the compound semiconductor such as GaP, GaAs, GaAsP and the like.

7 Claims, 9 Drawing Figures

METHOD OF ETCHING A SEMICONDUCTOR ELEMENT

The present invention relates to a method of etching semiconductor element and more particularly to an improvement of gas etching method effective to a chemical compound semiconductors.

In a semiconductor element such as GaP and InGaP light emitting diodes when PN junction is exposed to external, the exposed portion of the junction is etched, thereby removing crystal defects and surface contamination so as to improve a current-voltage characteristics of the PN junctions. In such an etching method, hot aqua regia is generally used as an etching solution, and etching is performed by dipping or emersing the semiconductor substrate in the etching solution for more than a few minutes. While, in this case, in order to perform a selective etching a mask is required, which can endure to the etching solution as an etching mask In case of hot aqua regia, $SiO_2$, $Si_3N_4$, $Al_2O_3$ and the like processed through CVD method or spattering method can be used. However, in such an etching method it is necessary to rinse and to remove water through distillate or pure water after etching since the etching is done humidly. Moreover, there will be a problem such that metal ions in a solution contaminate the semiconductor surface. Also, it is very difficult to obtain a stable film as the etching masks, other than those which are formed by CVD (Chemical Vapor Deposition) method or spattering method. In addition, in order to form the stable film by the two methods described above expensive facilities and a high technical skills are required. For instance, in the hot aqua regia etching method for $SiO_2$ film through "Spinning-on" method. (The method is referred to a method in which a wafer of semiconductor is placed on a rotating spinner and a solution is applied onto the wafer.) in which coating is performed by rotating a coating machine like a spinner, the film is abraded from the semiconductor surface due to weakness in adhesive strength between $SiO_2$ film and the semiconductor while the etching solution penetrates the bonded portion between the film and the semiconductor, so that a selective etching can not be done satisfactorily. In the meantime, the spinning-on method, as compared with the CVD or spattering method, enables the device to be more economical while the method of spraying is also simple. However, when the hot aqua regia is used as an etching solution there is a drawback that the adhesive strength between the mask and the semiconductor is weak.

As the counterpart of such method of humidly etching by use of the hot aqua regia, there is a method of dryly etching which utilizes the high temperature reaction of HCl gas. However, the etching through the HCl gas is performed in a high temperature of about 800°C, so that when an etching should be performed after forming PN junction of GaP, for instance, a favorable result can not be obtained due to the undesirable diffusion of the impurity at the high temperature during etching. In case the etching is performed after the PN junction of GaP was formed, it is necessary to carry out the etching at a temperature sufficiently low, which does not affect the PN junction, or in case it is performed after formation of electrodes, it is necessary to carry out the etching at the temperature lower than that of alloy temperature of about 500°C.

A primary object of the present invention is, therefore, to provide an improved etching method capable of dryly performing an etching at a comparatively low temperature.

An object of the present invention is, to provide a strikingly high speed etching method as compared with the etching method through the hot aqua regia.

A further object of the present invention is to provide an effective etching method for oxide films formed by a simple method such as a Spinning-on method, as well.

A still further object of the present invention is to provide an etching method capable of performing an etching in such a way that the cross-section of the etched surface is acute, or capable of selectively performing an etching with respect to the direction of a crystal.

A still further object of the present invention is to provide an etching method particularly effective to the chemical compounds such as GaP, InGaP, GaAs, InP, InAs, GaAlAs, GaAsP and the like.

A still further object of the present invention is to provide an effective etching method for use after forming the PN junction of the semiconductor as well as after forming ormic alloy electrodes.

A still further object of the present invention is to provide a gas etching method by exerting on the semiconductor surface a gas which is obtainable by dripping a mixture of hydrogen chloride (HCl) and nitric acid solution ($HNO_3$) into a gas generating device, or which is produced from a mixture gas of HCl gas and $HNO_3$ gas, as well as which is generated by passing $HNO_3$ gas through HC1 solution.

These and other objects and advantages and features of the present invention will be more apparent from the following description in conjunction with the accompanying drawings in which;

FIG. 4(B) shows a cross-sectional view of the etched portion conductor according to the present invention.

FIG. 4 (C) shows a cross-sectional view of the etched portion of the semiconductor according to the method of the present invention in which water vapour is applied in an etching gas.

Now an explanation is made to an etching method according to the present invention in which a mesa type light-emitting diode made of, for example, GaP.

Figure 1:
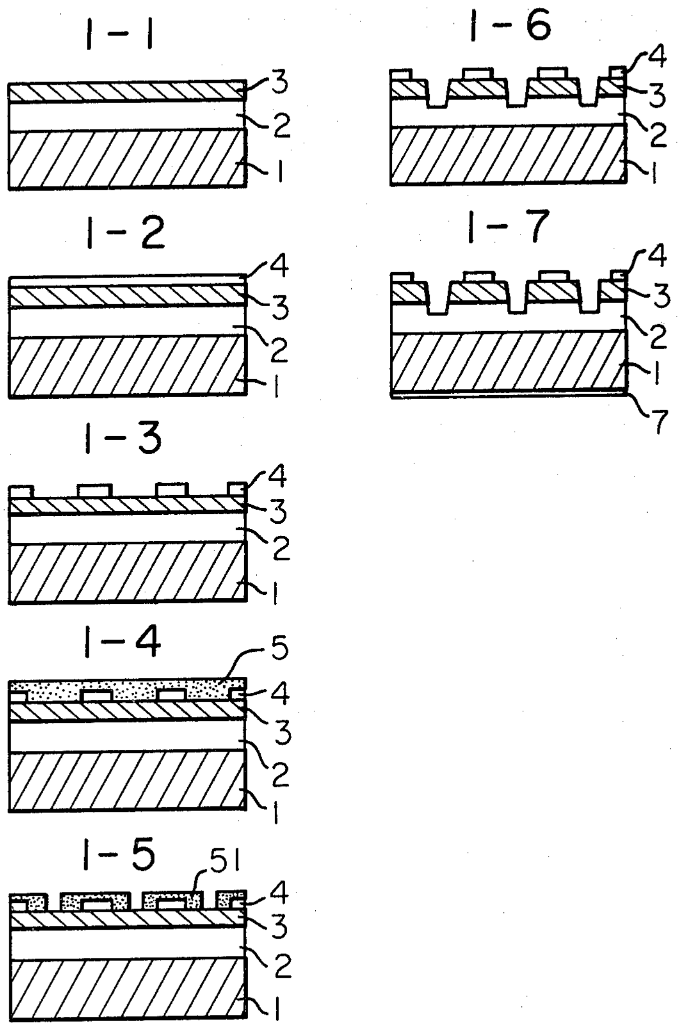
FIG. 1 shows a process of making a mesa-type luminescence diode according to the present invention.
Figure 2:
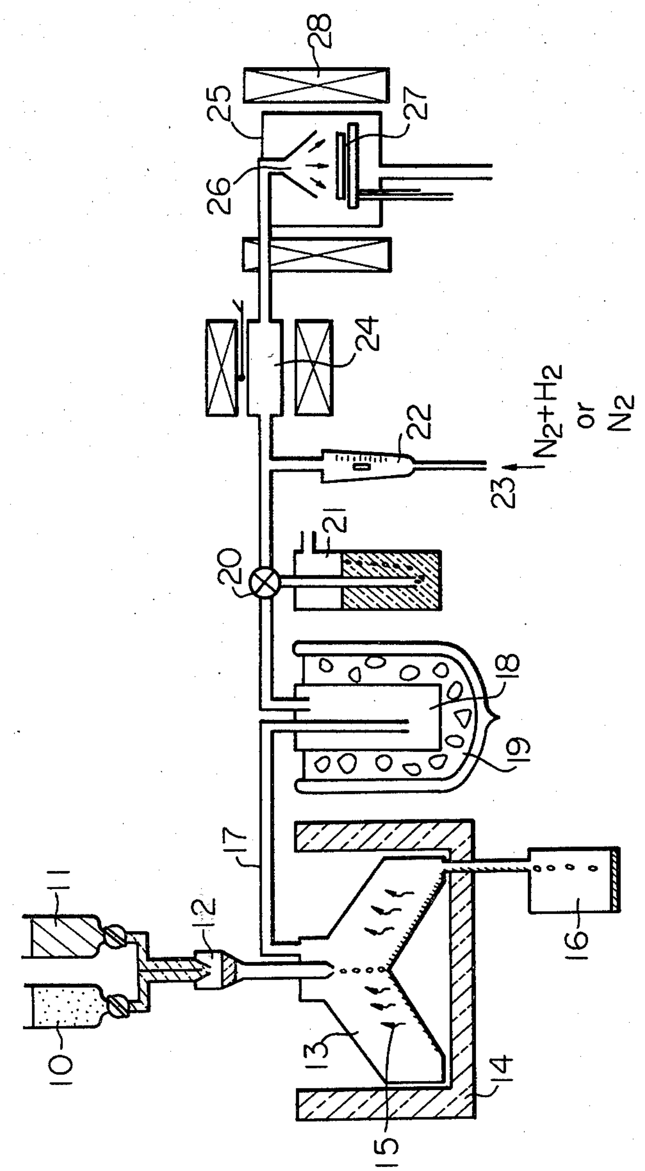
FIG. 2 shows a process for realizing a method according to the present invention.

Referring to FIG. 1, where a method of making a mesa type light emitting diode is shown. In order to make the diode, N-type GAP substrate 1 is first prepared. N-type GaP layer 2 is formed thereon through a liquid phase epitaxial method, and then P-type GaP layer 3 is formed as shown in FIG. 1-1. Next, AuZn alloy or Au-Be alloy is evaporated on the P-type layer 3 as P-type electrodes 4 by 2,000 to 5,000 A by a vacuum evaporation method as shown in FIG. 1-2. After that, the alloy layer is partially removed by a photo-etching method as shown in FIG. 1-13. Then, as shown in FIG. 1-4, a $SiO_2$ film of organic oxirane compound having about 1,000 to 4,000 A in thickness is formed on the P-type layer 3 and P-type electrodes 4 by coating silicon acetate solution by the spinner and also by heating the film thus formed. Next, only the necessary portion of the silica film is left, removing other remaining portions in order to form a etching masks 51 through the photo-etching method as shown in FIG. 1-5. The element thus made is etched to form a mesa type structure by an etching method according to the present invention through a process shown in FIG. 2, which will be described hereinafter in greater detail.

The etching masks made of $SiO_2$ film are removed after the etching process is finished. Finally, Au-Si alloy or Au-Sn alloy is evaporated on the rear of the N-type substrate 3,000 to 10,000 A to form the N-type electrode 7, and then it is thermally processed in a mixture of $N_2$ gas and $H_2$ gas at the temperature from 400°C to 600°C for a few minutes and an ohmic process is performed as shown in FIG. 1-7.

In FIG. 2, there is shown an etching process or an etching system which is useful for realizing the etching method according to the present invention in which the semiconductor substrate with the etched masks 51 being provided on the PN junction shown in FIG. 1-5 is etched to make a mesa type element. In the figure, hydrogen chloride (HC1) 10 of, for instance, 35% and nitric acid solution ($HNO_3$) 11 of, for instance, 60% are dripped in a funnel 12 with a ratio of 3:1, for example, and they are mixed therein and then dropped into the gas generating device 13. The amount of the gas to be generated can be varied in accordance with change in the ratio of the mixture between the HC1 and $HNO_3$ to be dropped in the gas generating device 13. The gas generating device 13 is controlled at the temperature of about 120°C by the heating device 14 and the solution of the mixture thus dripped reacts quickly in accordance with reaction formula of $HNO_3 + 3HC1 \rightarrow C1_2 + NOC1 + 2H_20$ and the etching gas 15 is generated. In this case, the excess mixture solution which terminated the reaction is flown along the declivity of the gas generating device 13 to drop into the reservoir 16. While the etching gas 15 generated is applied to the condensation device 18 through the conduit 17 of the gas generating device 13. As the condensation device 18 is cooled by ice water 19 at the temperature of 0°C the vapour containing in the etching gas is condensed and separated in the condensing device 18 and only dry gas is conducted to the exchange vave 20. The flow meter 21 is a foam counting type and checks the etching gas flow a constant value, such as 50cc/min to 500cc/min through the exchange valve 20 by checking the amount of the foam and after the measurement the valve is exchanged to send the gas to the heating device 24. The dry etching gas which passed through the valve 20 is mixed with the nitrogen gas ($N_2$) or a mixture of $N_2$ gas and $H_2$ gas from the flow meter 22, and then is applied to heating or thermal device 24, where it is heated at about 250° to 400°C. The flow of the carrier gas 23 is controlled at about 200cc/min to 1,000cc/min. The dry etching gas which was preheated in the heating device 24 at about 250° to 400° C is sprayed to the semiconductor substrate 27 uniformly from the nozzle 26 of the reaction device 25 after completion of the process as shown in FIG. 1-5, and the semiconductor substrate 27 is etched. In this case, the reaction device 25 is heated at about 200° to 400° C by the electrical furness 28. The etching temperature, that is the temperature of the semiconductor substrate, may slightly be lower than that of the reaction device described above, but it is necessary to maintain the temperature at least above the boiling point of water. If it is below the boiling point, the moisture are adsorbed in the semiconductor surface, so that the effect of the dry etching will be reduced for all the merits thereof. The mesa type semiconductor substrate thus etched through the etching method will have a mesa-type structure as shown in FIG. 1-6. After etching the etching gas is switched to the foam type flow meter through the exchange valve 20, and the heating device 24 is turned OFF. This enables the atmosphere in the reaction device 25 to be rapidly exchanged by the carrier gas which is introduced through the floating type flow meter 22. In this case, the mesa-etched semiconductor substrate 27 is cooled by running OFF the electrical furness 28. After completing this etching process, the semiconductor substrate 27 is picked up from the reaction device 25 and the electrodes are provided thereon as shown in FIG. 1-7, thus completing the semiconductor element.

In the above description, after an etching gas is produced in the gas generating device 13 the dry gas is obtained by removing the moisture through the condensing device 18. However, the dry gas may not necessarily be a 100% dry gas, that is, a small amount of vapour may be included in the etching gas which is jetted from the nozzle 26, or the vapour may slightly be added to the dry gas from external. Addition of a small amount of vapour enables the etching speed control, configuration control on a cross section to be etched, or the etching speed control in the direction of the crystal.

In the foregoing embodiment, an explanation is made only to an etching method concerning a semiconductor substrate and a manufacturing process which realizes the method. However, the present invention is also useful for an etching of other chemical compounds likewise as it is useful for CVD method other than the Spinning-on method with respect to the formation of the oxide film for etching.

As described hereinbefore, the dry etching method according to the present invention is effective in etching the compounds semiconductor such as GaP, InP, GaAs, and the like at the low temperature of 200° to 400° C and a stable etching can be realized even to the SiO oxide film by the Spinning-on method without contamination of metal ions to the semiconductor. Moreover, no characteristic change due to the impurity diffusion which is resulted from a high temperature hydrogen chloride gas is brought out. Particularly, since the gas etching by the hydrogen chloride gas, for instance, according to the prior art does not necessitate a high temperature of about 800° C, the etching processing after formation of the PN junction or formation of ormic alloy electrodes has encountered some difficulties. Whereas in a method according to the present invention even if the mesa-etching would be performed after forming the semiconductor element, the element having a favorable characteristics without disparity can be obtained without disturbing the PN junction formed in the previous process as well as without disturbing the distribution of the impurity in the element.

Now an explanation will be made hereinafter to effects of the present invention in which the method is being applied to the GaP semiconductor element. However, it will be apparent that the present invention is also applicable to the compound semiconductor element such as GaAs, GaAsP, GaAlAs, InP and the like.

Figures 3, 4:
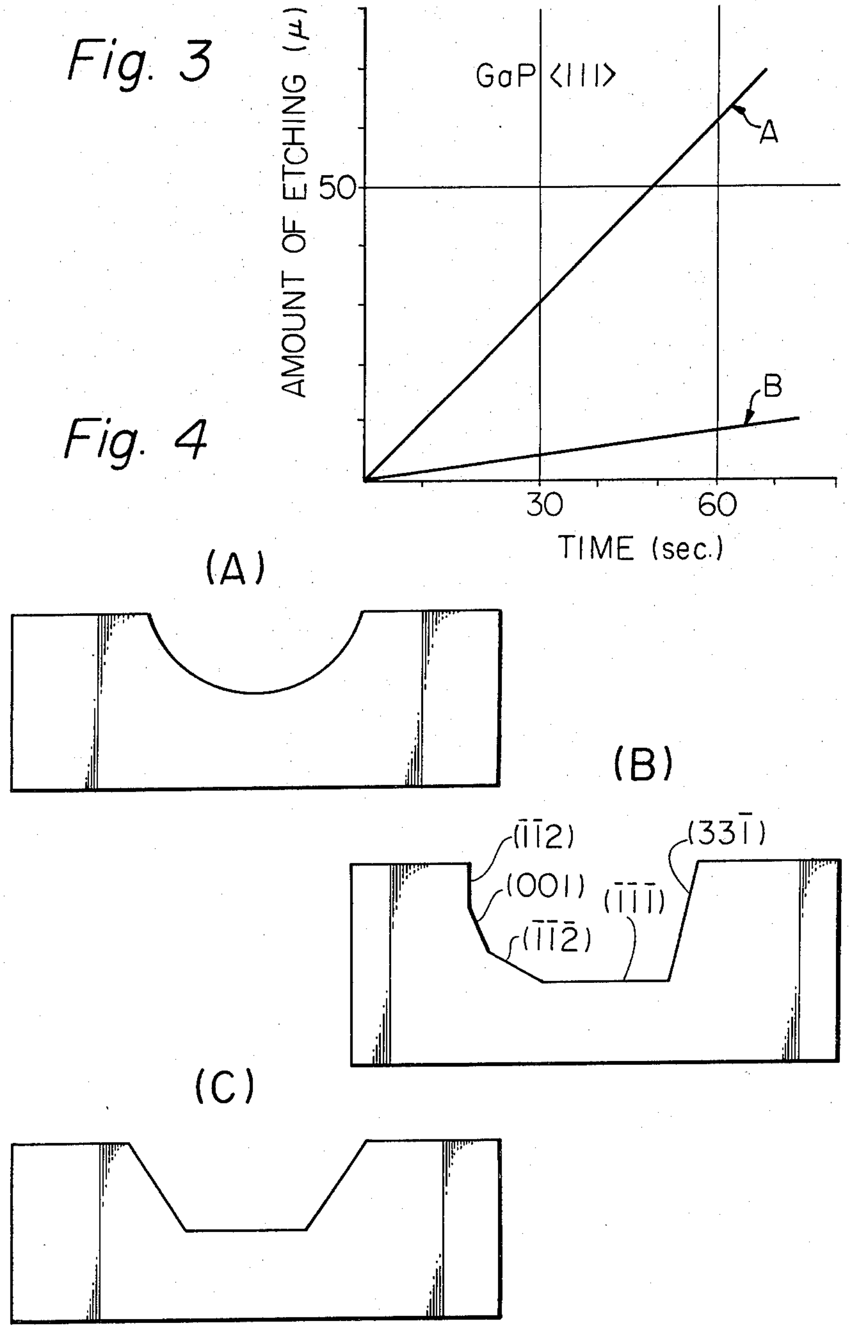
FIG. 3 shows a difference in the etching speed between the present invention and the prior art.
FIG. 4 (A) shows a cross-sectional view of the etched portion of a semiconductor by the hot aqua regia method.

In FIG. 3, there is shown a graph showing an etching speed through the gas etching method according to the present invention compared with that of the prior art through the hot aqua regia for the purpose of comparison, wherein line A indicates a characteristics according to the present invention and line B indicates one according to the prior art with respect to the face $(\bar{1}\bar{1}\bar{1})$ of GaP. From the graph it is appreciated that the etching speed by the method according to the present invention is far faster than that by the method according to the prior art.

In FIG. 4, the shapes of the cross sections of a semiconductor are shown respectively in accordance with the present invention and the prior art, in which FIG. 4(A) shows a cross section according to the prior art utilizing the hot aqua regia method and FIG. 4(B) shows one according to the present invention. From the figures, it is appreciated that the cross section according to the prior art has a more smoothing surface, while that of the present invention has somewhat a very sharp surface. As shown in FIG. 4(B), if amount of vapour contained in the etching gas could be reduced to zero or to near zero the etching selectivity in the direction of the crystal would be remarkably enphasized. FIG. 4(C) shows a cross section of the element according to the method of the present invention in which vapour is added to the etching gas. As will be understood from the foregoing description, an addition of vapour into the etching gas enables the shape of the cross section to be etched to vary. In the method according to the present invention, the etching speed can be controlled by parameters such as the ratio of the concentration between the etching gas and the carrier gas, flow treating temperature, and the amount of the vapour to be added to the etching gas.

Figure 5:
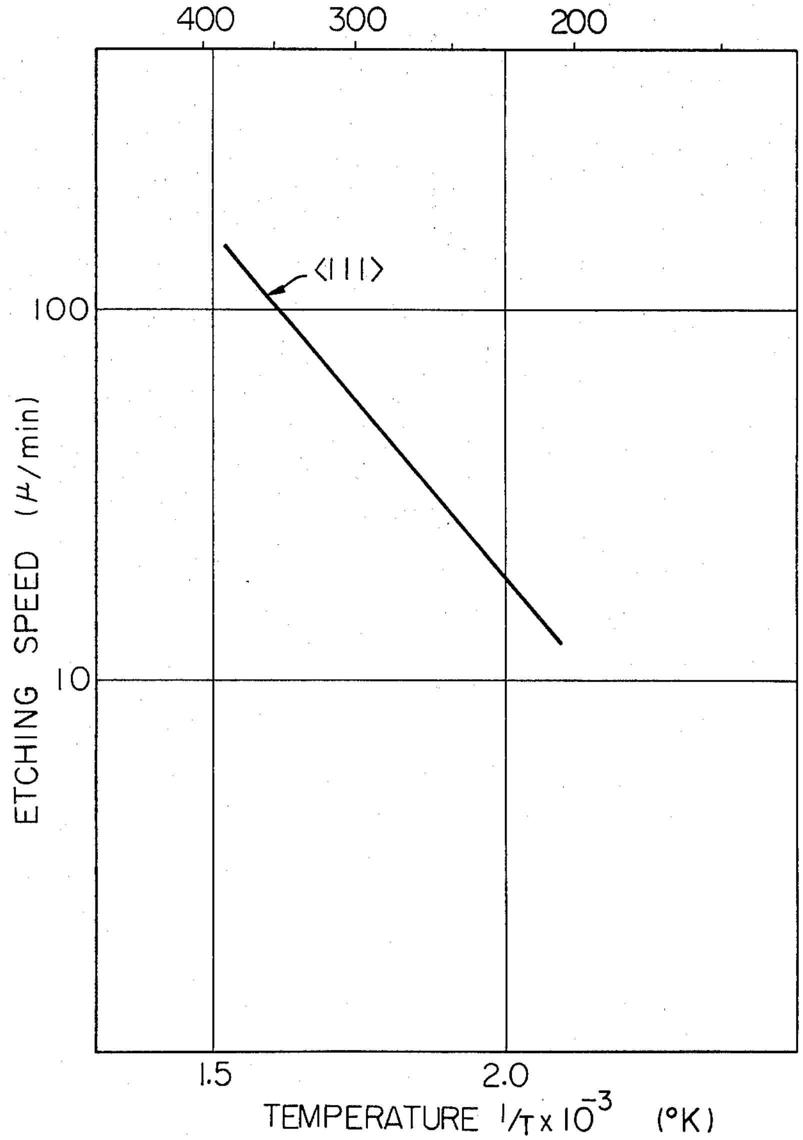
FIG. 5 shows a relation between etching temperature and etching speed.
Figure 6:
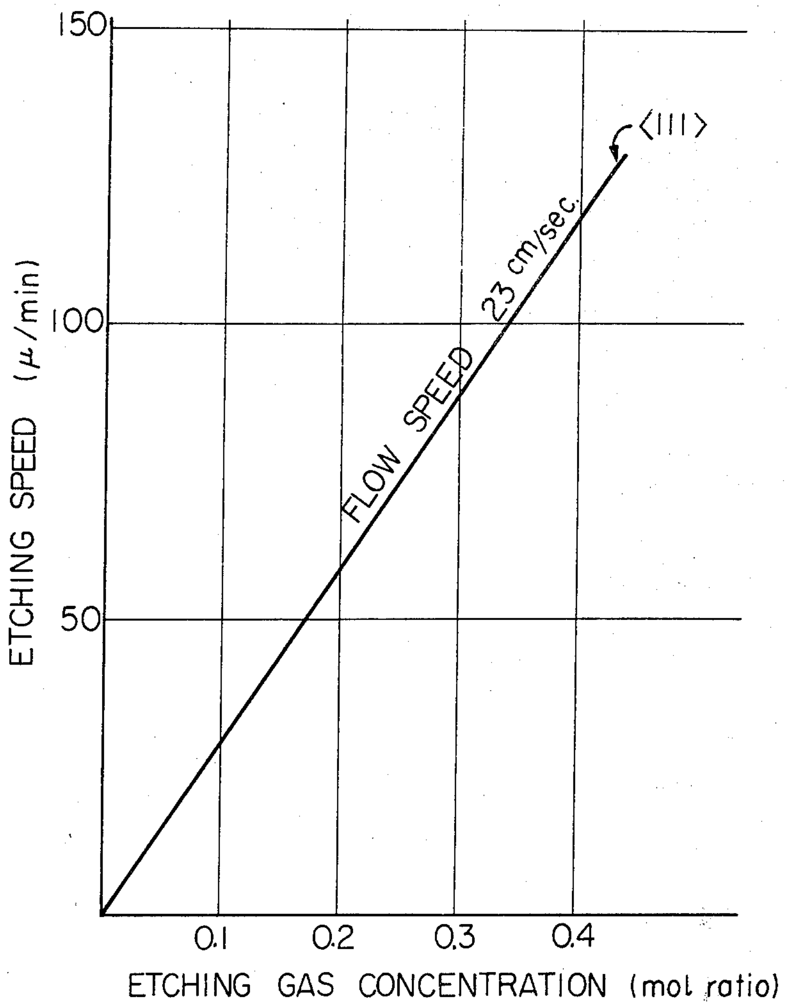
FIG. 6 shows a relation between etching gas density and etching speed.

In FIG. 5, a relationship between the etching speed and treating temperature is shown where the etching gas concentration, and low maintain constant. As is understood from the figure, the higher the treating speed becomes the faster the etching speed. In FIG. 6, there is shown a relationship between the concentration of the etching gas included in the carrier gas and the etching speed. It is also to be understood that the higher the concentration of the etching gas becomes the faster the etching speed becomes. Moreover, according to present the invention, it is to be noted that different etching speeds can be obtained in accordance with the direction of the crystal.

Figure 7:
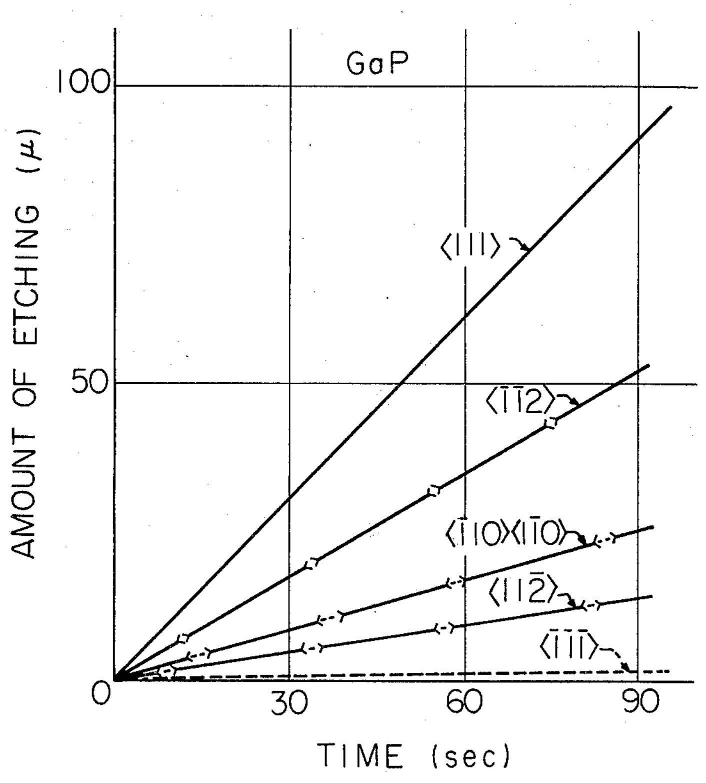
FIG. 7 shows a characteristics of etching speed in the direction of crystal.

FIG. 7 shows a relationship between the direction of crystal and etching speed at time of etching. From the figure it is apparent that an etching speed of each direction within the face $(\bar{1}\bar{1}\bar{1})$ is slower than that of the direction within the face $(\bar{1}\bar{1}\bar{1})$. This means that undesirable face etching will be prevented when an etching is performed with respect to the face $(\bar{1}\bar{1}\bar{1})$. Moreover, from the fact that the etching speed is different or selective in accordance with the directions of crystal, it is appreciated that the method according to the present invention is effective and is preferred in view of the crystal growing, particularly in such a case that an etching hole is perforated in the crystal substrate and an epitaxial layer is selectively grown. The reason for this is that a crystal surface appears on the etching holl. In a method according to the present invention, the following features will be enumerated. Since the etching can be performed at the final process of the semiconductor, the etched surface portion of the semiconductor, when combined together with the CVD device, can be treated stably by such as $SiO_2$ film. Without taking out of the device after mesa-etching, contrary to the conventional etching method such as a wet etching method, or a high gas etching method. Accordingly, the life time of the semiconductor device will be more extended as well as it can be manufactured more stably.

In the foregoing embodiment according to the present invention, an explanation is made to a method of producing an etching gas in which a mixture of hydrogen chloride and nitric acid solution is applied to the heated gas generating device. However, it is to be appreciated that the method is not limited to these described above, but a mixture of HCL gas and $HNO_3$ gas may be also used for carrying out the same purpose and producing the same effect by reacting the same. Similarly, it is also possible to produce the etching gas by passing the $HNO_3$ gas through the hydrogen chloride solution or vice versa by passing the HCl gas through the $HNO_3$ solution and by reacting them, respectively. The present invention may be also performed by using a mixture of NOCl gas and $Cl_2$ gas as an etching gas. After all in the foregoing description, HCl, or $HNO_3$ may be either gases or solutions.

From the description hereinabove, the method of etching semiconductor according to the present invention is characterized in that the etching is performed at the temperature higher than the boiling point of water with respect to the produced gas which is obtainable from a mixture including either an aqueous solution or a gaseous mixture and consisting of HCl and $HNO_3$.

It is also appreciated that the method according to the present invention enables the semiconductor to be etched faster than the conventional etching method such as hot aqua regia method, the semiconductor having superior or excellent characteristics.

What is claimed is:

1. A method of gas-etching, which comprises applying and etching gas composed of NOCl and $Cl_2$, which is generated through the reaction of HCl and $HNO_3$, onto a semiconductor substrate while maintaining the temperature of said semiconductor substrate at a predetermined temperature above the boiling point of up to 400° C.

2. A method according to claim 1 wherein said predetermined temperature is 200° to 400° C.

3. A method according to claim 1, which further comprises regulating the ratio of water contained in said etching gas.

4. A method according to claim 1, which further comprises preheating said etching gas at 250° to 400° C.

5. A method according to claim 1, in which said etching gas is generated by dripping a mixture of HCl solution and $HNO_3$ solution into a gas generating device.

6. A method according to claim 1, in which said etching gas is generated by mixing HCl and $HNO_3$ gas.

7. A method according to claim 1, in which said etching gas is generated by passing $HNO_3$ gas through HCl solution.

* * * * *